(12) United States Patent  
Mahnad

(10) Patent No.: US 8,923,104 B1
(45) Date of Patent: Dec. 30, 2014

(54) FAST ADC FOR OPTICAL TAPE WOBBLE SIGNAL

(71) Applicant: Oracle International Corporation, Redwood Shores, CA (US)

(72) Inventor: Faramarz Mahnad, Brookline, MA (US)

(73) Assignee: Oracle International Corporation, Redwood Shores, CA (US)

(*) Notice: Subject to any disclaimer, the term of this patent is extended or adjusted under 35 U.S.C. 154(b) by 0 days.

(21) Appl. No.: 14/090,249

(22) Filed: Nov. 26, 2013

(51) Int. Cl.
  *G11B 7/00* (2006.01)
  *G11B 20/10* (2006.01)
  *G11B 7/007* (2006.01)

(52) U.S. Cl.
  CPC *G11B 20/10342* (2013.01); *G11B 2007/00754* (2013.01)
  USPC .......................................... 369/44.26

(58) Field of Classification Search
  None
  See application file for complete search history.

(56) References Cited

U.S. PATENT DOCUMENTS

| 7,142,486 | B2* | 11/2006 | Masui et al. | 369/44.29 |
| 7,177,244 | B2* | 2/2007 | Hashimoto | 369/44.34 |
| 7,889,110 | B2* | 2/2011 | Tayu | 341/159 |
| 7,933,173 | B2* | 4/2011 | Senba | 369/44.13 |
| 2007/0025202 | A1* | 2/2007 | Huh et al. | 369/44.13 |
| 2007/0064566 | A1* | 3/2007 | Hsu et al. | 369/53.34 |
| 2009/0153387 | A1* | 6/2009 | Tayu | 341/159 |
| 2010/0074076 | A1* | 3/2010 | Moon | 369/53.3 |
| 2011/0261661 | A1* | 10/2011 | Matsuda et al. | 369/44.13 |

* cited by examiner

*Primary Examiner* — Brenda Bernardi
(74) *Attorney, Agent, or Firm* — Brooks Kushman P.C.

(57) ABSTRACT

An analog-to-digital converter includes a feedback loop that receives a wobble signal having a wobble signal frequency. The feedback loop includes a comparator that receives the wobble signal through a first resistive component at a first comparator input and outputs a first output signal having either a high output or a low output. The feedback loop also includes a sampling component that samples the first output signal at a sampling frequency and outputs a second output signal and a first integrator component that receives the second output signal and outputs a third output signal. The third output signal tracks the wobble signal due to feedback action in the feedback loop. Finally, the analog-to-digital converter further includes a final discrete integrator component that integrates the second output signal to provide a digital representation of the wobble signal.

17 Claims, 8 Drawing Sheets

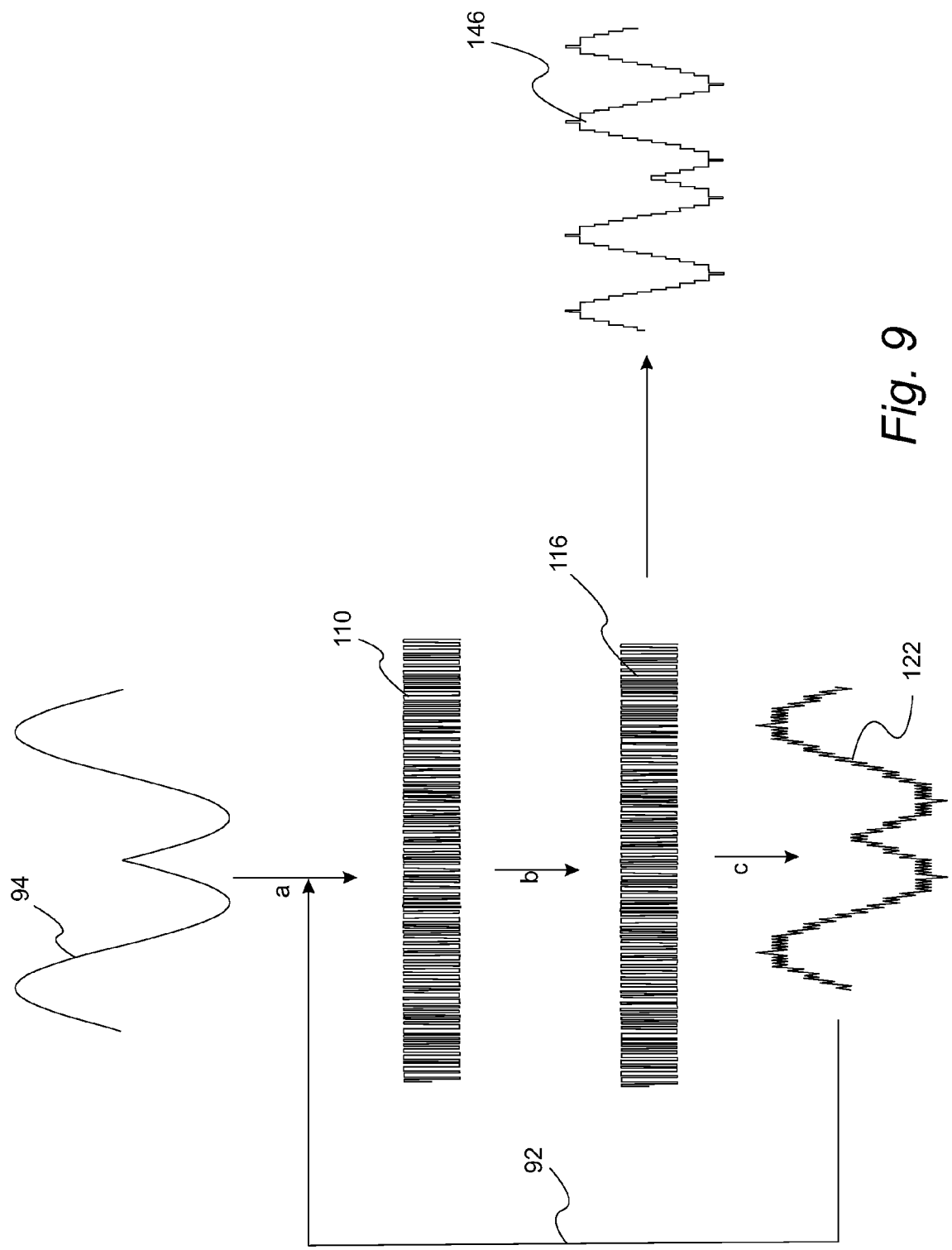

FAST ADC FOR OPTICAL TAPE WOBBLE SIGNAL

TECHNICAL FIELD

In at least one aspect, the present invention is related to methods and apparatuses for digitizing an analog signal, and in particular, an analog wobble signal.

BACKGROUND

Servo systems in optical data recording devices such as optical tape drives utilize tracking error signals, detected from the optical media via an optical pickup unit (OPU) device, to accurately record and then retrieve data on the optical media.

FIGS. 1 and 2 illustrate a portion of a typical optical recording medium. FIG. 1 is a top view while FIG. 2 is a side view. Optical data storage medium 10 includes a nanostructure surface relief pattern embossed on the surface of the optical medium. The nanostructure includes lands 12 and grooves 14 embossed in the Z direction (i.e., parallel to the face of optical data storage medium 10) thereon in a performing process. These surface relief patterns are used to generate the tracking signals used by a servo system to track the position of an optical head reading or writing to the medium. An optical drive OPU with the aid of electronic signal processing generates a tracking error signal (TES) from the detected patterns. In order to establish an addressing capability for these recording tracks, the edges of these embossed lands 12 and grooves 14 relief patterns are structurally modulated in the horizontal directions parallel to the face of optical recording data storage 10 (e.g., Y axes to track X axes) with sinusoidal patterns 16 (i.e., wobbles) which contain individual track address codes. These wobble patterns embedded (or embossed) on the surface of optical data storage media such as optical tape, during media pre-formatting process, and thereafter detected by the optical read element during normal operation of the data storage devices are the essential part of reliable data recording and retrieval functionality of the these devices. FIG. 1 also depicts recording marks 18 encoded thereon.

A technique referred to as "Radial Push Pull" Tracking signal generation (also referred to as "Main Push Pull" (MPP)), have been conventionally used to generate the Tracking Error Signal (TES) for the rewritable optical recording media preformatted with "land" and "groove" track geometries as set forth above. This scheme generates a reference tracking signal based on the geometries of land and grooved tracks on the media and detectable by a main quad photodetector (QPD) of the OPU. FIG. 3 provides a schematic illustration of a typical signal processing scheme for the TES signal generated by the QPD. Signal processing system 20 includes recording/reading head 21. Recording/reading head 21 includes quad photodetector 22 which includes individual photodetectors 24, 26, 28, and 30. Signals 32, 34, 36, 38 from photodetectors 24, 26, 28, 30 are amplified by amplifiers 42, 44, 46, 48 to provide signals 52, 54, 56, 58. Signals 52, 54 are provided to adder 60 which outputs summed signal 62. Signals 56, 58 are provided to adder 64 which outputs summed signal 66. Summed signal 62 and summed signal 66 are inputted into subtractor circuit 70 with outputs difference signal 72 which is further processed to provide TES signal 78 and wobble signal 80. For example, low pass filter 82 receives difference signal 72 as an input and outputs TES signal 78 while band pass filter 84 receives difference signal 72 and outputs wobble signal 80. The high frequency wobble signal includes, among other information, the key data track ID and Address codes. Moreover, TES signal 78 and wobble signal 80 are used by recording/reading head servo system 86 to provide positioning information regarding the position of head 21. In particular, digital servo systems control the dynamic operation of the OPUs by using wobble signal information to place the OPU on the correct desired data track. Additional methods for detecting wobble signals and/or Tracking Error Signals are set forth in U.S. Pat. Nos. 5,383, 169; 6,009,059; and 6,937,542; the entire disclosures of which are hereby incorporated by reference.

In the current optical tape methodologies, the multiple OPUs with multiple data recording zones on the media are utilized. In such systems, many analog-to-digital converters (ADC's) are needed to digitize the multiple wobble signals from multiple recording zones to be used by system Digital Signals Processors. Since there are significant number of wobble signals present in such system, the excessive cost, space utilization, power consumption, and high number of inputs and output associated with the requisite numerous ADCs pose a serious produced feasibility problem Accordingly, there is a need for improved methods of digitizing wobble signal in optical data storage systems.

SUMMARY

The present invention solves one or more problems of the prior art by providing in at least one embodiment a mixed signal analog-to-digital converter for digitizing an optical wobble signal. The analog-to-digital converter includes a feedback loop that receives the wobble signal having a wobble signal frequency. The feedback loop includes a comparator that receives the wobble signal through a first resistive component at a first comparator input and outputs a first output signal having either a high output or a low output. The feedback loop also includes a sampling component that samples the first output signal at a sampling frequency and outputs a second output signal. The sampling frequency is at least 50 times greater than the wobble signal frequency. The feedback loop also includes a first integrator component that receives the second output signal and outputs a third output signal. The output signal is provided to the first comparator input through a second resistive component such that the third output signal tracks the wobble signal due to feedback action in the feedback loop. Finally, the analog-to-digital converter further includes a final discrete integrator component that integrates the second output signal to provide a digital representation of the wobble signal. Advantageously, the mixed signal analog-to-digital converter of the present embodiment provides a low cost, low component ADC to be used in optical storage devices.

In another embodiment, a method for digitizing an optical tape wobble signal having a wobble signal frequency is provided. In one variation, the method is performed by the analog-to-digital converter set forth above. The method includes a step of applying the wobble signal to a comparator at a first comparator input through a first resistive component. The comparator outputs a first output signal that is either high or low. The first output signal is sampled at a sampling frequency such that a second output signal is outputted. Characteristically, the sampling frequency is at least 50 times greater than the wobble signal frequency. The second output signal is integrated to form a third output signal. The third output signal is provided to the first comparator input through a second resistive component such that the third output signal tracks the wobble signal due to a feedback loop. The second output signal is integrated to provide a digital representation of the wobble signal.

BRIEF DESCRIPTION OF THE DRAWINGS

Exemplary embodiments of the present invention will become more fully understood from the detailed description and the accompanying drawings, wherein:

FIG. 9 provides a schematic flowchart summarizing the method implemented by the analog-to-digital converter of FIG. 4.

DETAILED DESCRIPTION

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Figure 1:
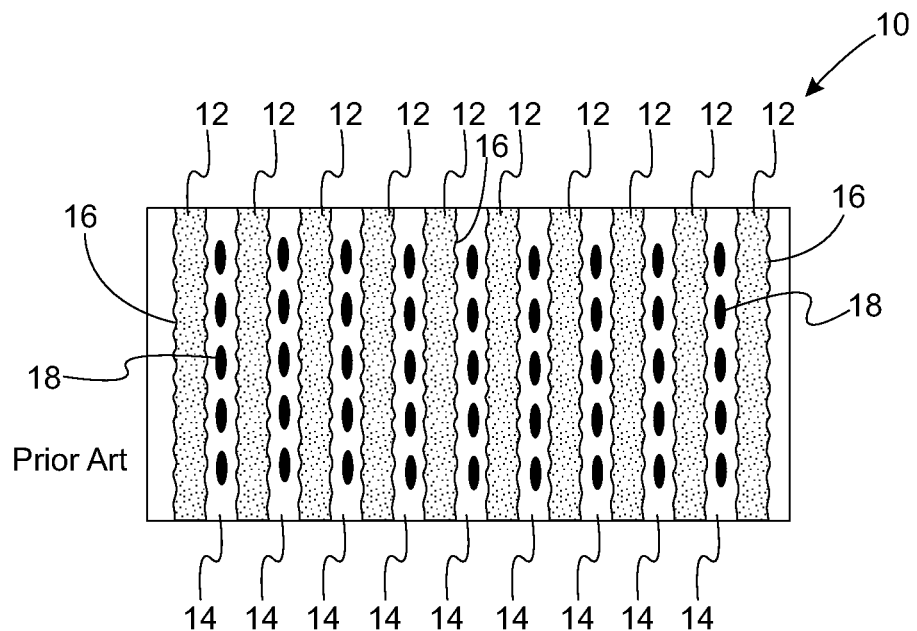
FIG. 1 provides a top view of optical recording media showing the embossed lands and grooves.
Figure 2:
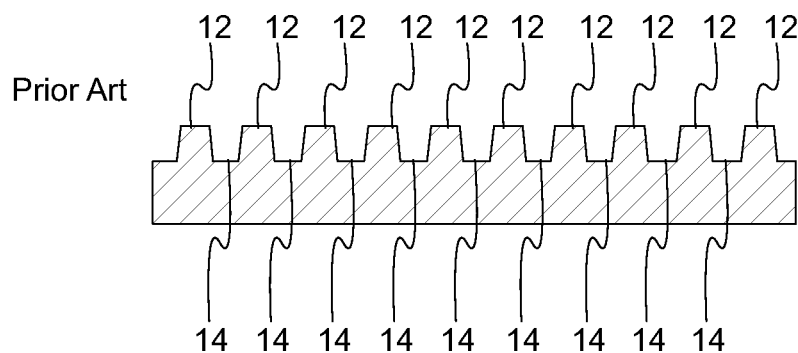
FIG. 2 provides a side view of optical recording media showing the embossed lands and grooves.
Figure 3:
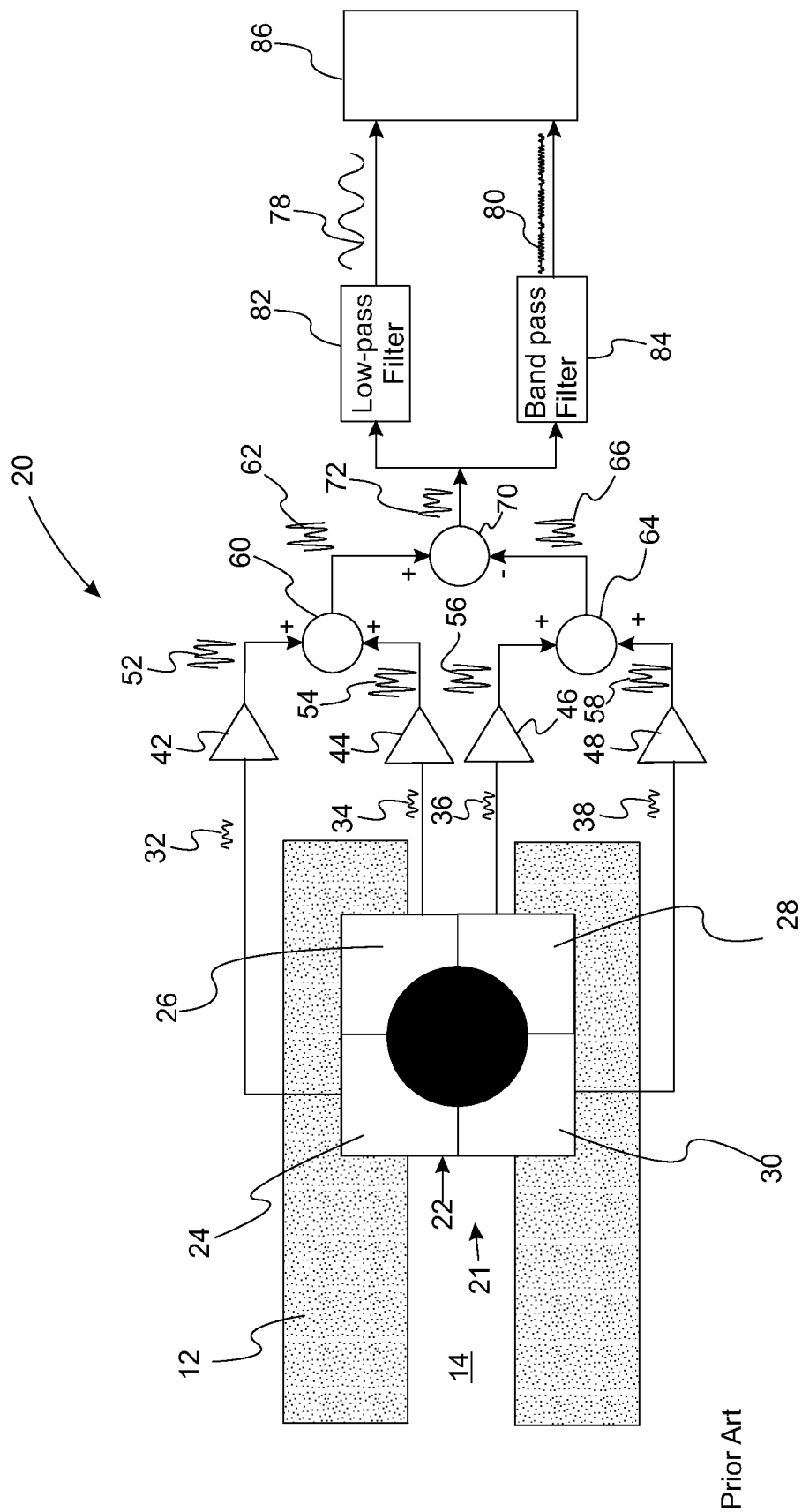
FIG. 3 provides a schematic illustration of a system for detecting a wobble signal from an optical storage medium having wobble patterns embossed thereon.
Figure 4:
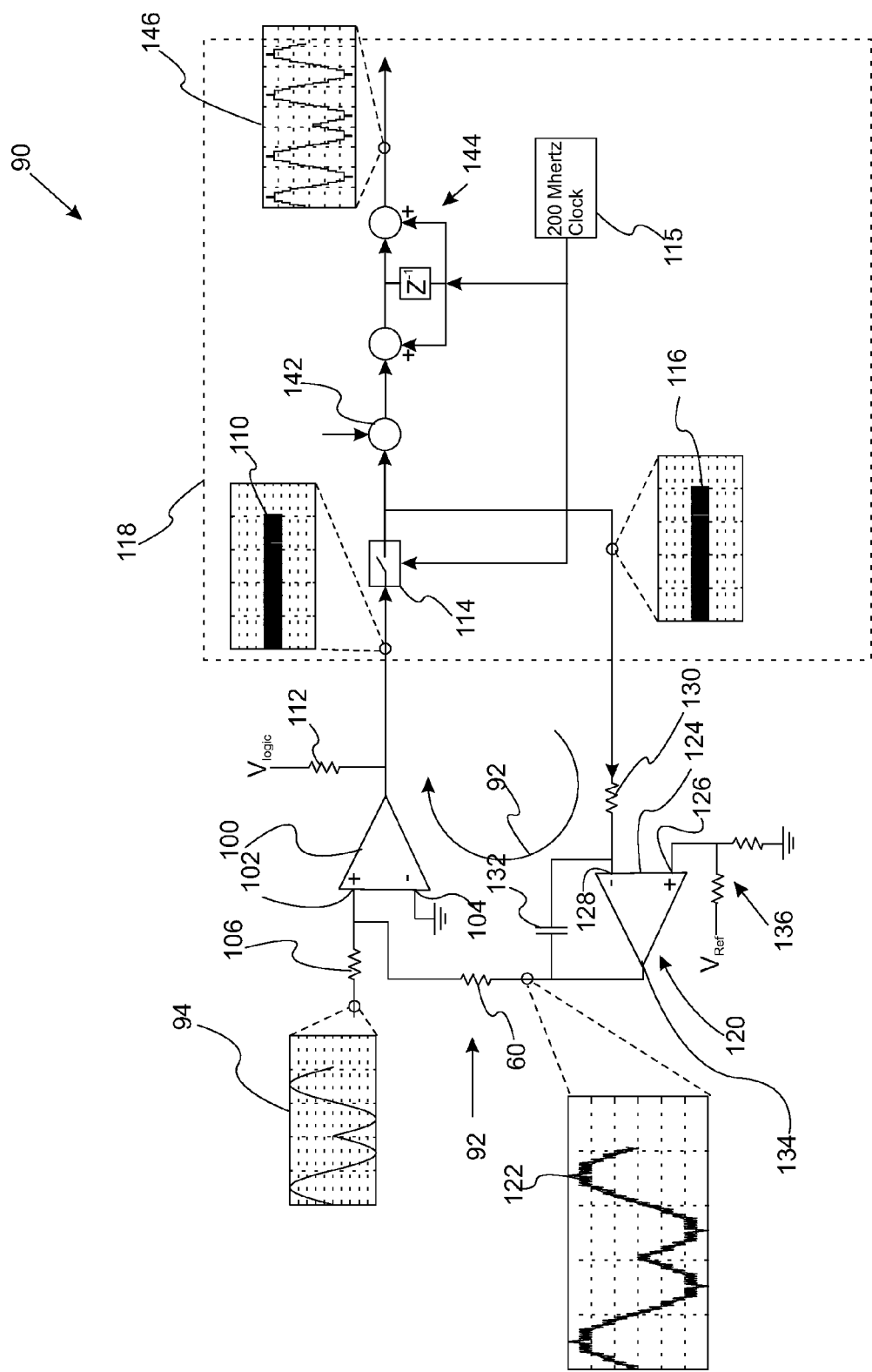
FIG. 4 is a schematic diagram of a mixed signal analog-to-digital converter for digitizing a wobble signal.
Figure 5:
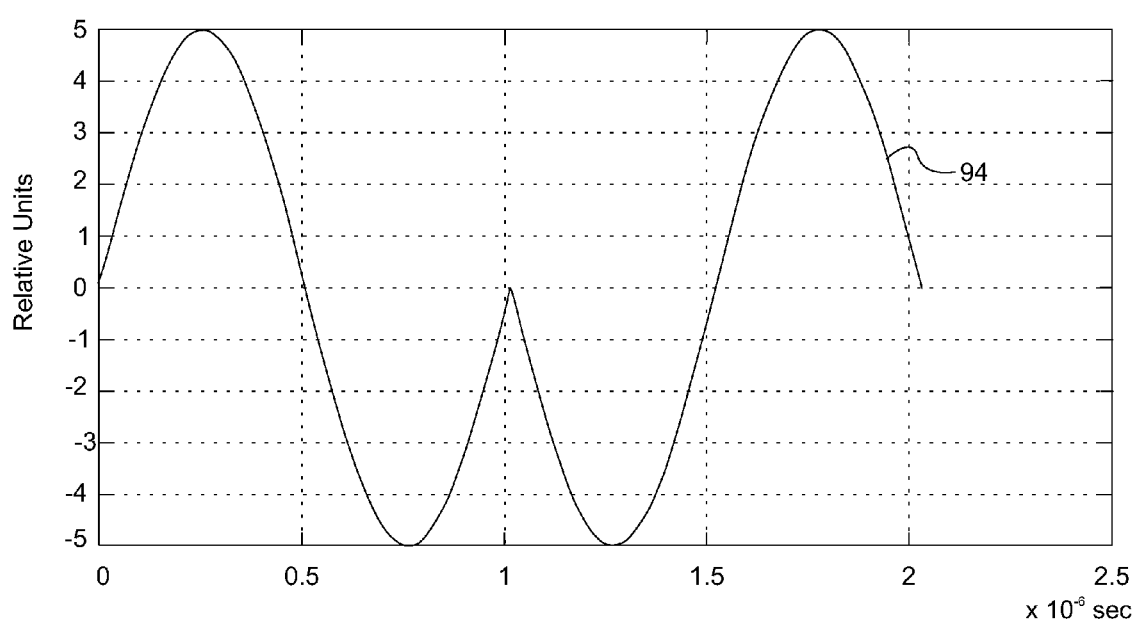
FIG. 5 is a plot of a typical wobble signal that is digitized by the analog-to-digital converter of FIG. 4.

With reference to FIG. 4, an analog-to-digital converter for digitizing an optical wobble signal is provided. Analog-to-digital converter 90 includes feedback loop 92 that receives wobble signal 94 having a wobble signal frequency. In a refinement, the wobble signal frequency is from 0.5 megahertz to 10 megahertz. FIG. 5 provides a plot of a typical wobble signal which is inputted to analog-to-digital converter 90. Typically, wobble signal 94 is generated from a wobble detection system such as the prior art system depicted in FIG. 2.

Figure 6:
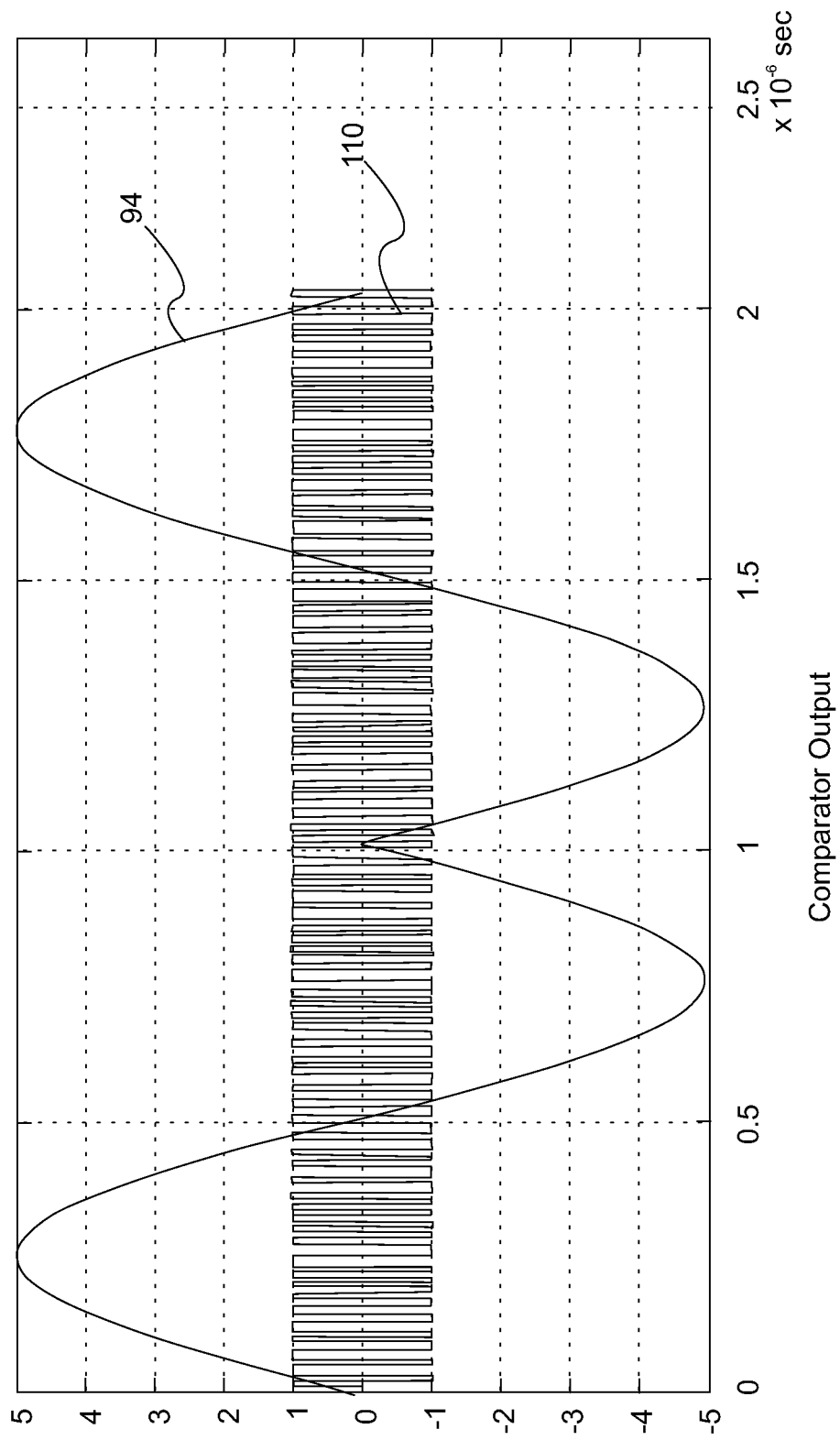
FIG. 6 is a plot of the output of a comparator utilized in the analog-to-digital converter of FIG. 4 with the corresponding wobble signal also plotted.

Still referring to FIGS. 4 and 5, feedback loop 92 includes comparator 100 which includes an operational amplifier. Comparator 100 typically includes non-inverting input 102 and inverting input 104. Comparator 100 receives wobble signal 94 through first resistive component 106 at a first comparator input (e.g., non-inverting input 102). First resistive component 106 includes one or more resistors. A reference voltage (e.g., ground or zero volts) is inputted to inverting input 104. Comparator 100 outputs first signal output 110 which is a logical two level signal alternating between a high output value or a low output value. In this regard, pull-up resistor 112 is used to ensure that the output switches between the high value $V_{logic}$ and a low value (e.g., 0 volts). Advantageously, the high value and low value allow binary encoding of the output. FIG. 6 provides a plot of first signal output 110 with the corresponding wobble signal also plotted.

Still referring to FIG. 4, feedback loop 92 also includes sampling component 114 that samples the first output signal 110 at a sampling frequency and outputs second output signal 116. In a refinement, sampling component 114 includes a transistor switch driven by a control signal operating at the sampling frequency received from clock 115, and in particular, a MOSFET transistor switch. It should also be appreciated that sampling component 114 may also be programmed into a field-programmable gate array (FPGA) 118 as set forth below. Typically, the sampling frequency is at least 50 times greater than the wobble signal frequency. In a refinement, the sampling frequency is at least 100 times greater than the wobble signal frequency. In still another refinement, the sampling frequency is from about 50 to about 1000 times the wobble signal frequency.

Figure 7:
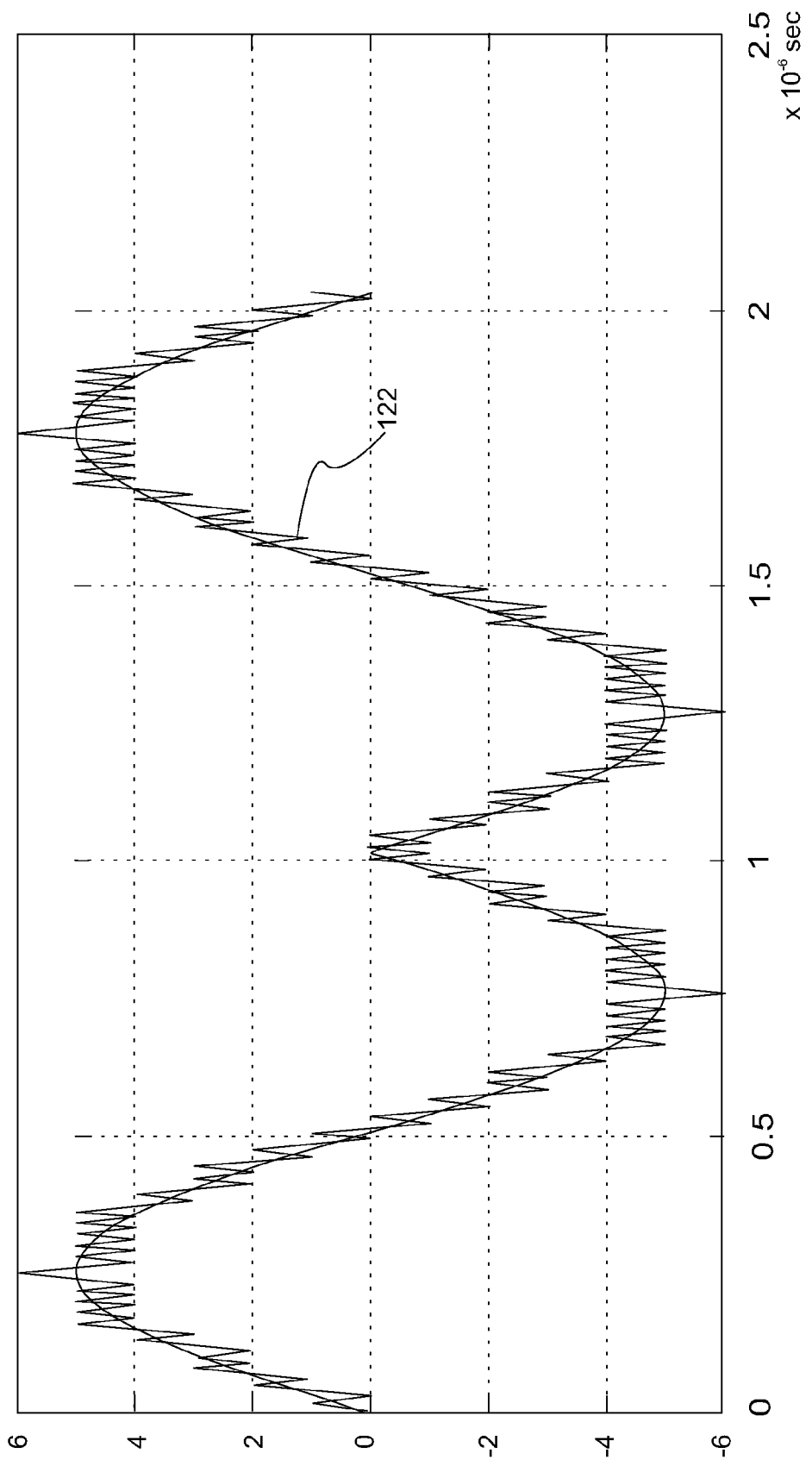
FIG. 7 is a plot of the output of an integrator in a feedback loop contained in the analog-to-digital converter of FIG. 4.

Feedback loop 92 also includes first integrator component 120 that receives the second output signal 116 while outputting and outputs a third output signal 122. FIG. 7 provides a plot of the output of first integrator component 120. In a refinement, first integrator 120 is an operational amplifier integrator. For example, the first integrator includes operational amplifier 124 having non-inverting input 126 and inverting input 128 such that second output signal 116 is provided inverting input 128 via resistor 130. Capacitor 132 electrically connects inverting input 128 to output 134 of operational amplifier 124. A voltage derived from voltage divider 136 is provided to non-inverting input 126. Third output signal 122 is provided to comparator input 102 through second resistive component 140 such that the third output signal tracks the wobble signal due to feedback action in the feedback loop 92. Typically, second resistive component 140 includes one or more resistors. In particular, the high bandwidth feedback control law of feedback loop 92 enforces the accurate pattern matching of the wobble signal 94 and third output signal 122. Moreover, integrator action in the feedback path of the loop provides signal differentiation in the forward path.

Figure 8:
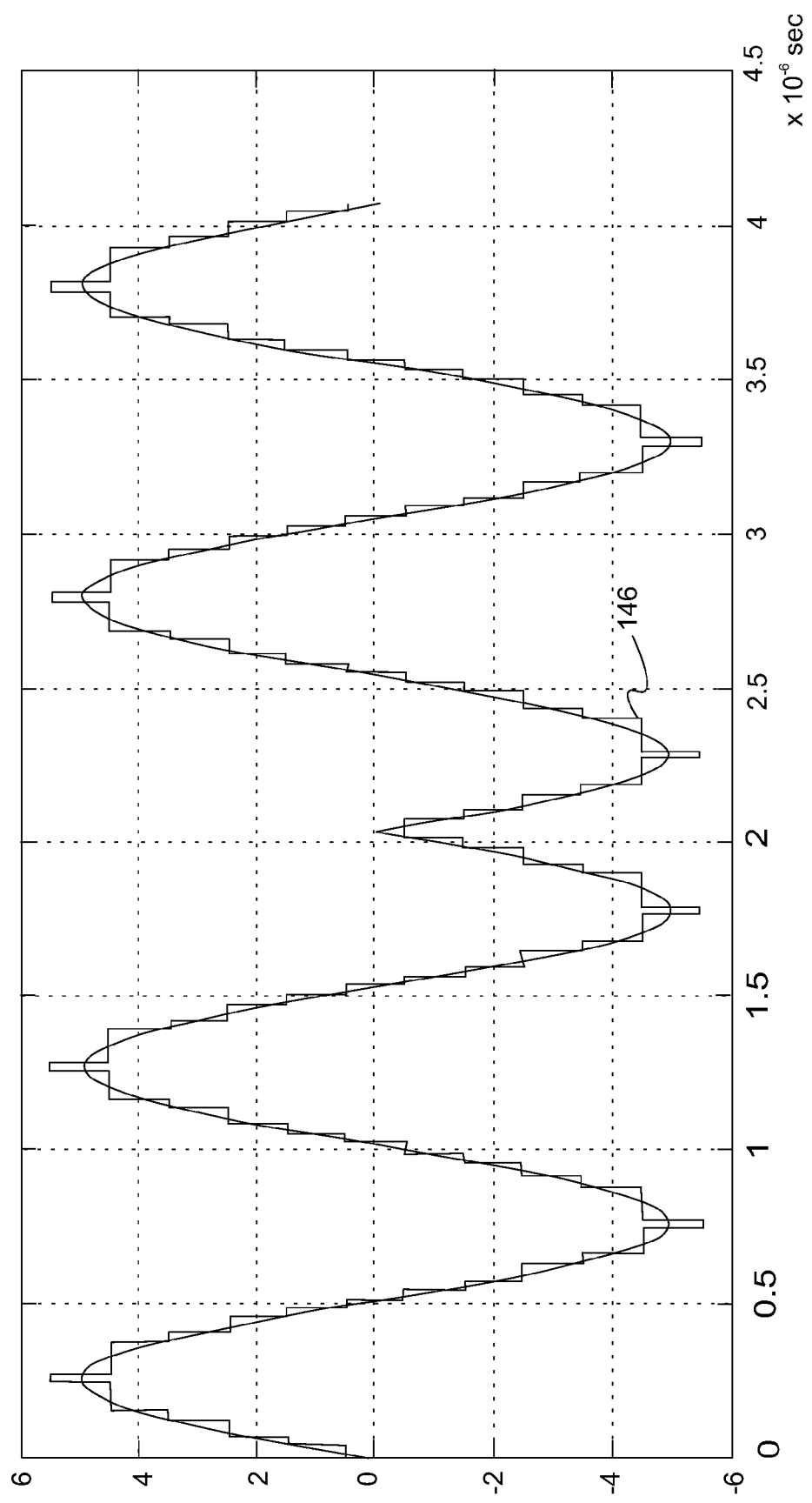
FIG. 8 is a plot of the final output of a final integrator used in the analog-to-digital converter of FIG. 4.

In a refinement, a level shifter 142 shifts the second signal by a voltage offset prior to the second signal being received by the final integrator. Finally, the analog-to-digital converter 90 further includes final discrete integrator component 144 that reconstructs second output signal 116 in the discrete domain to provide a digital representation of the wobble signal as fourth signal 146. In a refinement, final discrete integrator component 144 is a low pass filter, and in particular, an infinite impulse response (IIR) filter. FIG. 8 provides a plot of an example with signal 146 overlaying an input wobble signal. In a variation, a field-programmable gate array (FPGA) 118 includes sampling component 114, level shifter 142, and final discrete integrator component 144.

With reference to FIG. 9, a schematic flowchart illustrating the method implemented by the analog-to-digital converter set forth above is provided. In step a), a wobble signal 94 is applied to a comparator at a first comparator input through a first resistive component. The comparator outputs first output signal 110 which alternates between a high output voltage value or a low output voltage value as set forth above. In step b), first output signal 110 is sampled at a sampling frequency such that a second output signal 116 is outputted. Characteristically, the sampling frequency is at least 50 times greater than the wobble signal frequency as set forth above. In step c), second output signal is integrated to form third output signal 122. The third output signal is provided to the first comparator input through a second resistive component such that the third output signal tracks the wobble signal due to a feedback loop 92. In step d), the second output signal is integrated to provide a digital representation 146 of the wobble signal.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An analog-to-digital converter for digitizing an optical tape wobble signal, the analog-to-digital converter comprising:
    a feedback loop that receives the wobble signal having a wobble signal frequency, the feedback loop including:
        a comparator that receives the wobble signal through a first resistive component at a first comparator input and outputs a first output signal having a high voltage output value or a low voltage output value;
        a sampling component that samples the first output signal at a sampling frequency and outputs a second output signal, the sampling frequency being at least 50 times greater than the wobble signal frequency; and
        a first integrator component that receives the second output signal and outputs a third output signal, the third output signal being provided to the first comparator input through a second resistive component, wherein the third output signal tracks the wobble signal due to feedback action in the feedback loop; and
    a final discrete integrator component that integrates the second output signal to provide a digital representation of the wobble signal.

2. The converter of claim 1 wherein the wobble signal frequency is from 0.5 megahertz to 10 megahertz.

3. The converter of claim 1 wherein the first integrator is an operational amplifier integrator.

4. The converter of claim 1 wherein the final integrator is a digital integrator.

5. The converter of claim 1 wherein the final integrator is an infinite impulse response filter.

6. The converter of claim 1 wherein the sampling frequency is at least 100 times greater than the wobble signal frequency.

7. The converter of claim 1 wherein the sampling component includes a transistor switch that is driven by a control signal operating at the sampling frequency.

8. The converter of claim 7 wherein the sampling component is a MOSFET.

9. The converter of claim 1 wherein a range of the first output signal is set by a reference voltage and a third resistive component to set a logic level.

10. The converter of claim 1 further including a level shifter that shifts the second signal prior to the second signal being received by the final integrator.

11. A method for digitizing an optical tape wobble signal having a wobble signal frequency, the method comprising:
    a) applying the wobble signal to a comparator at a first comparator input through a first resistive component, the comparator outputting a first output signal;
    b) sampling the first output signal at a sampling frequency and outputting a second output signal, the sampling frequency being at least 50 times greater than the wobble signal frequency;
    c) integrating the second output signal to form a third output signal, the third output signal being provided to the first comparator input through a second resistive component, wherein the third output signal tracks the wobble signal due to a feedback loop; and
    d) integrating the second output signal to provide a digital representation of the wobble signal.

12. The method of claim 11 wherein the wobble signal frequency is from 0.5 megahertz to 6 megahertz.

13. The method of claim 11 wherein the comparator includes an operational amplifier.

14. The method of claim 11 wherein step d) is performed by an operational amplifier integrator.

15. The method of claim 11 wherein step d) is performed by an infinite impulse filter.

16. The method of claim 11 wherein the sampling frequency is at least 100 times greater than the wobble signal frequency.

17. The method of claim 12 further comprising level shifting the second signal prior to step d).

\* \* \* \* \*

UNITED STATES PATENT AND TRADEMARK OFFICE
CERTIFICATE OF CORRECTION

| | | |
|---|---|---|
| PATENT NO. | : 8,923,104 B1 | Page 1 of 1 |
| APPLICATION NO. | : 14/090249 | |
| DATED | : December 30, 2014 | |
| INVENTOR(S) | : Mahnad | |

It is certified that error appears in the above-identified patent and that said Letters Patent is hereby corrected as shown below:

In the Specification

In column 1, line 23, delete "performing" and insert -- preformatting --, therefor.

Signed and Sealed this
First Day of September, 2015

Michelle K. Lee
*Director of the United States Patent and Trademark Office*